(12) United States Patent
Bednorz et al.

(10) Patent No.: US 7,466,579 B2
(45) Date of Patent: Dec. 16, 2008

(54) FIELD EFFECT DEVICE WITH A CHANNEL WITH A SWITCHABLE CONDUCTIVITY

(75) Inventors: Georg J. Bednorz, Wolfhausen (CH); David J. Gundlach, Adliswil (CH); Siegfried F. Karg, Adliswil (CH); Gerhard J. Meijer, Zurich (CH); Heike E. Riel, Rueschlikon (CH); Walter H. Riess, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 11/513,862

(22) Filed: Aug. 31, 2006

(65) Prior Publication Data

US 2006/0289908 A1 Dec. 28, 2006

Related U.S. Application Data

(63) Continuation of application No. 10/987,749, filed on Nov. 12, 2004, now Pat. No. 7,130,212.

(30) Foreign Application Priority Data

Nov. 26, 2003 (EP) ................... 03405846

(51) Int. Cl.
*G11C 11/22* (2006.01)
(52) U.S. Cl. .............. 365/145; 365/185.26; 365/185.27
(58) Field of Classification Search ................ 365/145, 365/185.26, 185.27, 185.18, 185.24, 163, 365/177; 257/213

See application file for complete search history.

(56) References Cited

U.S. PATENT DOCUMENTS 4,745,448 A * 5/1988 Van Rees et al. ............ 257/284

5,196,717 A * 3/1993 Hiroki et al. .................. 257/21

(Continued)

FOREIGN PATENT DOCUMENTS

WO WO 00/49659 8/2000

OTHER PUBLICATIONS

A. Beck et al., "Reproducible Switching Effect in Thin Oxide Films for Memory Applications," Applied Physics Letters, vol. 77, No. 1, pp. 139-141, Jul. 2000.

(Continued)

*Primary Examiner*—Dang T Nguyen
(74) *Attorney, Agent, or Firm*—Brian P. Verminski; Ryan, Mason & Lewis, LLP

(57) ABSTRACT

A field effect device includes a source electrode, a drain electrode spaced laterally apart from the source electrode, a channel formed between the source electrode and the drain electrode, and a gate electrode separated from the channel by an insulating layer. The channel includes a switching material that is reversibly switchable between a lower conductivity state and a higher conductivity state by at least one of: (i) application of a predetermined voltage between the source electrode and the drain electrode or between the gate electrode and at least one of the source electrode and the drain electrode, (ii) application of a voltage or a current to the switching material in the channel, and (iii) application of at least one of heat and light. Each of the conductivity states is persistent without the need for a sustaining excitation signal including an electrical field, heat and/or light applied to the device.

1 Claim, 2 Drawing Sheets

U.S. PATENT DOCUMENTS

| | | | |
|---|---|---|---|
| 5,240,906 A * | 8/1993 | Bednorz et al. | 505/193 |
| 5,317,174 A * | 5/1994 | Hynecek | 257/222 |
| 5,448,098 A | 9/1995 | Shinohara et al. | |
| 6,204,139 B1 | 3/2001 | Liu et al. | |
| 6,531,371 B2 | 3/2003 | Hsu et al. | |
| 6,562,672 B2 * | 5/2003 | Yamazaki et al. | 438/166 |
| 6,670,659 B1 * | 12/2003 | Gudesen et al. | 257/295 |
| 6,885,065 B2 * | 4/2005 | Liang et al. | 257/347 |
| 7,187,588 B2 * | 3/2007 | Iwata et al. | 365/185.28 |
| 2003/0156445 A1 | 8/2003 | Zhuang et al. | |
| 2004/0031975 A1 * | 2/2004 | Kern et al. | 257/213 |
| 2004/0228172 A1 * | 11/2004 | Rinerson et al. | 365/158 |
| 2005/0056825 A1 * | 3/2005 | Bertin et al. | 257/20 |

OTHER PUBLICATIONS

Y. Watanabe et al., "Current-Driven Insulator-Conductor Transition and Nonvolatile Memory in Chromium-Doped $SrTiO_3$ Single Crystals," Applied Physics Letters, vol. 78, No. 23, pp. 3738-3740, Jun. 2001.

C. Rossel et al., "Electrical Current Distribution Across a Metal-Insulator-Metal Structure During Bistable Switching," Journal of Applied Physics, vol. 90, No. 6, pp. 2892-2898, Sep. 2001.

K. Ueno et al., "Field-Effect Transistor on $SrTiO_3$ with Sputtered $Al_2O_3$ Gate Insulator," Applied Physics Letters, vol. 83, No. 9, pp. 1755-1757, Sep. 2003.

* cited by examiner

FIELD EFFECT DEVICE WITH A CHANNEL WITH A SWITCHABLE CONDUCTIVITY

CROSS-REFERENCE TO RELATED APPLICATION(S)

This application is a continuation of U.S. application Ser. No. 10/987,749, filed on Nov. 12, 2004, now U.S. Pat. No. 7,130,212 the disclosure of which is incorporated by reference herein.

FIELD OF THE INVENTION

The present invention refers to a field effect device with a channel with a switchable conductivity and to a non-volatile memory device using the same.

BACKGROUND OF THE INVENTION

For memory devices and for numerous other applications, bistable devices or circuits are used. For example, for storing one bit of information in a memory, a bistable device can be used which is switchable between (at least) two different and persistent states. When writing a logical "1" into the device, it is driven into one of the two persistent states and when writing a logical "0", or erasing the logical "1", the device is driven into the other of the two different states. Each of the states persists until a next step of writing information into the device or erasing information in the device proceeds. A huge number of such bistable devices arranged in one or more arrays may form an EEPROM (EEPROM stands for electrically erasable programmable read-only memory) as a separate memory device or as part of an even more complex device.

An important example for such a bistable device is a capacitor with a ferroelectric layer between its electrodes. The ferroelectric layer shows hysteresis polarization. The application of an electrostatic field causes a polarization of the ferroelectric material which persists after switching off the electrostatic field. The persistent remanence-polarization is deleted or erased or even inverted by an electrostatic field of opposite sign and sufficient strength.

When the ferroelectric layer is arranged between a gate and a channel of a field effectz transistor, the polarization state of the ferroelectric layer influences the number of charge carriers induced in the channel. In particular, the permittivity of the ferroelectric layer depends on its polarization state. Therefore, for the same device bias condition, the drain current depends on the polarization state of the ferroelectric gate dielectric layer.

When the ferroelectric layer is arranged between the electrodes of a capacitor, the polarization state influences the capacity of the capacitor. In both devices, the polarization state of the ferroelectric layer is switched by applying sufficiently high voltages between the capacitor electrodes or the gate and the channel, respectively.

A further bistable device is a resistor with two (or more) reversibly switchable and persistent resistance-states. The resistor is made of a material with respective reversibly switchable and persistent conductivity states.

U.S. Pat. No. 5,448,098 describes a superconductive photoelectric device with a superconductive thin film between two electrodes, the superconductive thin film having a photoconductive effect and converting from a normally conducting state to a super-conductive state in response to light irradiation.

U.S. Pat. No. 6,204,139 describes a method for switching properties of perovskite materials used in thin film resistors. The properties, in particular the conductivity, are switched reversibly by short electrical pulses. Application of the method for non volatile memory units and sensors with changeable sensitivity is proposed.

U.S. Pat. No. 6,531,371 describes an electrically programmable resistance cross point memory. At cross points of bit lines and word lines, perovskite material acts as variable resistors the resistance values of which can be changed reversibly and with hysteresis.

US 20030156445 A1 describes a method of changing the resistance of a perovskite metal oxide thin film device by means of a voltage pulse.

Other materials are described in the three articles and the international application publication mentioned subsequently.

The articles "Reproducible switching effect in thin oxide films for memory applications" (A. Beck et al., Applied Physics Letters, Vol. 77, No. 1, July 2000), "Current-driven insulator-conductor transition and nonvolatile memory in chromium-doped $SrTiO_3$ single crystals" (Y. Watanabe et al., Applied Physics Letters, Vol. 78, No. 23, June 2001) and "Electrical current distribution across a metal-insulator-metal structure during bistable switching" (C. Rossel et al., Journal of applied Physics, Vol. 90, No. 6, September 2001) and the international application publication WO 00/49659 A1 describe materials and classes of materials with hysteretically switchable electro static resistance, and simple resistor devices made from these materials.

The article "Field effect transistor on $SrTiO_3$ with sputtered $Al_2O_3$ gate insulator" (K. Ueno et al., Applied Physics Letters, Vol. 83, No. 9, September 2003) describes a field effect transistor with a channel at a surface of undoped $SrTiO_3$.

The above-mentioned devices provide switching speeds, power consumption and manufacturing costs which are still unsatisfactory for many applications.

SUMMARY OF THE INVENTION

The present invention relates to a field effect device having a source electrode, a drain electrode spaced laterally apart from the source electrode, a channel formed between the source electrode and the drain electrode, and a gate electrode separated from the channel by an insulating layer. The channel comprises a switching material that is reversibly switchable between a lower conductivity state and a higher conductivity state. Each of the conductivity states is persistent, i.e., non-volatile, without a need for a sustaining excitation signal including at least one of an electrical field, heat and light applied to the device.

The switching material is switchable from the lower conductivity state to the higher conductivity state by at least one of: (i) application of a predetermined voltage between the source electrode and the drain electrode or between the gate electrode and at least one of the source electrode and the drain electrode, (ii) application of a voltage or a current to the switching material in the channel, and (iii) application of at least one of heat and light.

When in a given one of the persistent conductivity states, application of a voltage having a magnitude which is greater than a prescribed voltage level to the gate electrode relative to at least one of the source electrode and drain electrode causes the switching material to switch between the lower conductivity state and the higher conductivity state or between the higher conductivity state and the lower conductivity state as a function of a polarity of the voltage applied to the gate electrode.

Application of a voltage having a magnitude which is less than or equal to the prescribed voltage level to the gate electrode relative to at least one of the source electrode and drain electrode causes a non-persistent change in the conductivity of the switching material. The amount of non-persistent change in the conductivity is a function of at least one of the magnitude and the polarity of the voltage applied to the gate electrode. Varying the voltage applied to the gate electrode causes a modulation of the electrical conductivity of the given conductivity state when the magnitude of the voltage is less than or equal to the prescribed voltage level and causes a switching of the conductivity state when the magnitude of the voltage is greater than the prescribed voltage level.

The basic idea underlying the present invention is to form the channel of a field effect transistor from a switching material reversibly switchable between (at least two different) persistent conductivity states. For a predetermined source-drain voltage, the drain current depends on the conductivity state of the switching material of the channel and on the voltage applied to the gate of the field effect transistor. The switching material of the channel can be driven into one of (at least) two different conductivity states by applying an electrostatic field, electrical current, heat, light, etc. The switching material may be crystalline, polycrystalline or amorphous, may be organic, inorganic, an organic-inorganic matrix or composite or a combination thereof and it may have a thickness ranging from several millimeters down to a few or 1 nm.

The present invention refers to all kinds of field effect devices and transistors comprising a channel between two electrodes or a channel layer in which a channel can be generated by application of an appropriate voltage to a gate electrode, wherein the gate electrode is separated and electrically insulated from the channel by an insulating layer or by a Schottky barrier. According to the present invention, the conductivity state can be switched reversibly between persistent conductivity states. Preferentially, within each of the conductivity states, the conductivity can be altered, or modified, by application of a voltage to the gate electrode.

These and other objects, features and advantages of the present invention will become apparent from the following detailed description of illustrative embodiments thereof, which is to be read in connection with the accompanying drawings.

BRIEF DESCRIPTION OF THE DRAWINGS

These and other objects and features of the present invention will become apparent from the following description taken in conjunction with the accompanying drawings, in which.

DETAILED DESCRIPTION OF PREFERRED EMBODIMENTS

Figure 1:
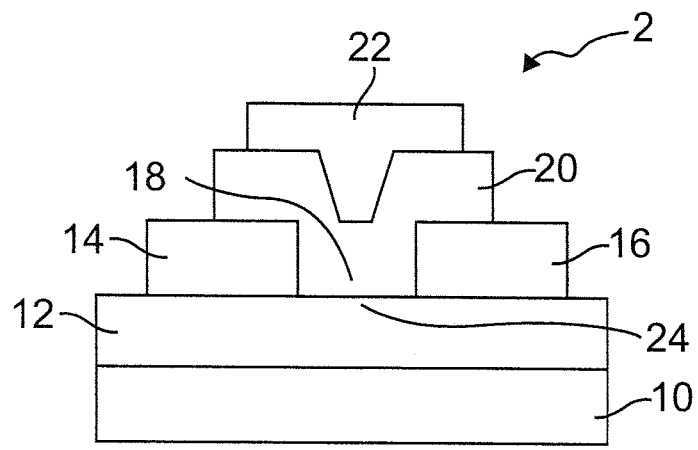
FIG. 1 is a schematic sectional view of a field effect transistor according to a first embodiment of the present invention.

FIG. 1 is a schematic sectional view of a field effect device that here is a field effect transistor 2. On a substrate 10, a channel layer 12 is formed, comprising $SrTiO_3$ doped with Cr. On top of the channel layer 12, a source electrode 14 and a drain electrode 16 are formed which are laterally spaced apart from each other, such that a gap 18 is formed between the source electrode 14 and the drain electrode 16. An insulating layer 20 is deposited in the gap 18 and partly over the source electrode 14 and the drain electrode 16. An electrically conductive layer is deposited over the insulating layer 20 and forms a gate electrode 22, which is separated and electrically isolated from the source electrode 14 and the drain electrode 16 by the insulating layer 20. A channel 24 is formed or can be formed essentially underneath the gate electrode 22 within the channel layer 12 and connects the source electrode 14 and the drain electrode 16. The conductivity of the channel 24 can be modified by application of a voltage to the gate electrode 22. There can be a predetermined voltage or predetermined range of voltages which cause essentially zero conductivity of the channel 24 when applied to the gate electrode 22. The channel layer 12 may be laterally restricted to the region of the channel 24 or may be laterally more extended.

The Cr-doped $SrTiO_3$ comprised in the channel layer 12 is electrically conductive. Its conductivity can be changed or switched or altered by applying an electrostatic field or a current, by applying heat or light. At least two of the conductivity states of the switching material of the channel layer 12 are persistent, i.e., they persist after removal of the applied electrical field, heat, light, etc. Switching between the at least two persistent conductivity states is reversible, i.e., it can be reversed by applying a sufficiently large bias voltage of opposite polarity and/or proper thermal or optical stimulation.

In the preferred embodiment shown in FIG. 1, the conductivity state of the switching material is switched by applying a predetermined voltage between the source electrode 14 and the drain electrode 16, whereby a charge, or charge carriers, are injected into or extracted from the switching material comprised in the channel layer 12, depending on the polarity and the strength of the electrostatic field. Alternatively, injection of charge carriers into the switching material or extraction of charge carriers from the switching material is caused by applying a predetermined voltage between the gate electrode 22 and the source electrode 14 and/or the drain electrode 16. The application of said predetermined voltages switches the switching material between conductivity states and thereby switches the conductivity of the switching material between at least a persistent higher conductivity state and a persistent lower conductivity state. In the lower conductivity state and the higher conductivity state, the conductivity of the switching material differs by up to a factor 1000 or even more.

Within at least one of the higher conductivity state and the lower conductivity state of the switching material, the conductivity of the switching material of the channel 24 can be further modified by applying a voltage to the gate 22. Whereas the conductivity states are persistent, modification of the conductivity by a voltage applied to the gate is not persistent.

For example, the switching material is driven into the higher conductivity state by applying a predetermined voltage (with predetermined value and predetermined polarity) to the gate electrode 22 relative to the source or the drain electrode 14, 16. This relatively high predetermined voltage causes an injection of charge carriers into the switching material, whereby at least a part of these charge carriers remain in the switching material even after the predetermined voltage is switched off and, thus, cause the persistent higher conductivity state.

The application of another relatively high voltage of opposite sign to the gate electrode 22 relative to the source or the drain electrode 14, 16, causes an extraction of charge carriers from the switching material and, consequently, a change to the lower conductivity state.

In each of the lower conductivity state and the higher conductivity state, application of a relatively low or moderate voltage to the gate electrode 22 causes a non-persistent change in conductivity, similar to a conventional field effect transistor. This non-persistent change in conductivity is, for example, due to a non-persistent accumulation or depletion of charge carriers in the channel layer 12 close to the interface of the channel layer 12 and the electrodes 14, 16 and the insulating layer 18 or due to an analogous depletion, respectively.

In at least one of the conductivity states, the conductivity of the channel 24 formed in the channel layer 12 between the source electrode 14 and the drain electrode 16 may range from that of an insulator to that of a superconductor in extreme cases.

Figure 2:
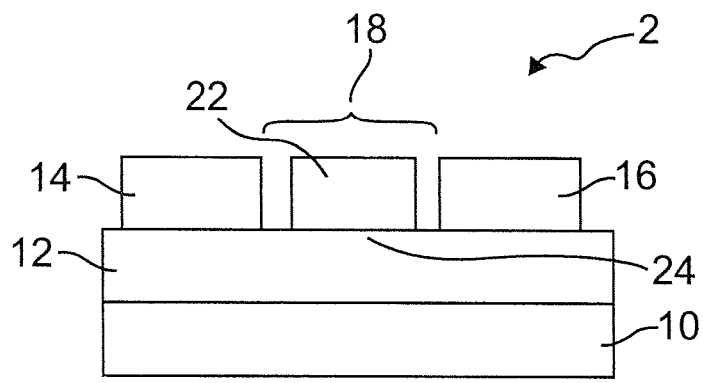
FIG. 2 is a schematic sectional view of a field effect transistor according to a second embodiment of the present invention.

FIG. 2 is a schematic sectional view of a field effect transistor 2 according to a second embodiment of the present invention. Again, a channel layer 12 comprising Cr-doped $SrTiO_3$ is deposited on a substrate 10. On top of the channel layer 12, the source electrode 14 and the drain electrode 16 are formed spaced apart from each other. The gate electrode 22 is arranged in a gap 18 between the source electrode 14 and the drain electrode 16 and is deposited directly on the channel layer 12.

Thus, the embodiment shown in FIG. 2 differs from the embodiment shown in FIG. 1 in that there is no insulating layer 20 between the gate electrode 22 and the channel layer 12. The gate electrode 22 shown in FIG. 2 is a Schottky-gate electrically insulated from the channel layer 12 by a Schottky-barrier resulting from the respective electronic properties of the materials and the majority charge carriers of the channel layer 12 and the gate electrode 22 and from the polarity of the voltage applied to the gate electrode 22 relative to the channel layer 12.

Figure 3:
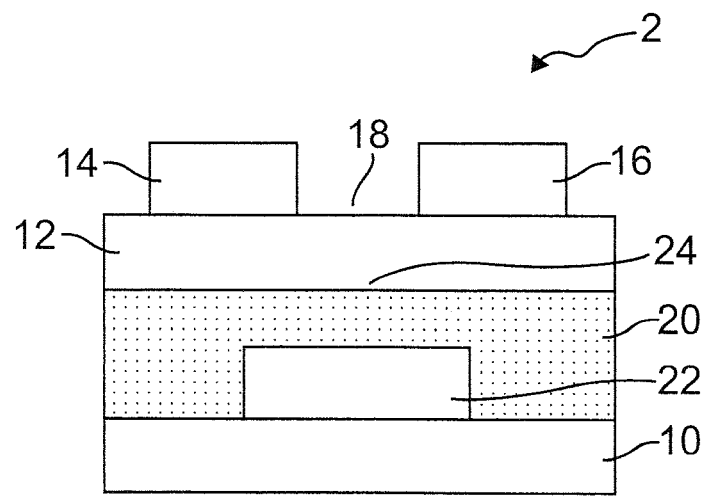
FIG. 3 is a schematic sectional view of a field effect transistor according to a third embodiment of the present invention.

FIG. 3 is a schematic sectional view of a field effect transistor according to a third embodiment of the present invention. In this embodiment, on a substrate 10, an insulating layer 20 is formed on top of which the channel layer 12 is deposited. On top of the channel layer 12 a source electrode 14 and a drain electrode 16 are formed laterally spaced apart from each other. A gate 22 is formed between the substrate 10 and the insulating layer 20 and is arranged opposed to a gap 18 between the source electrode 14 and the drain electrode 16.

Thus, the embodiment shown in FIG. 3 differs from the embodiment shown in FIG. 1 in that the stack channel layer 12—insulating layer 20—gate electrode 22 is inverted.

Figure 4:
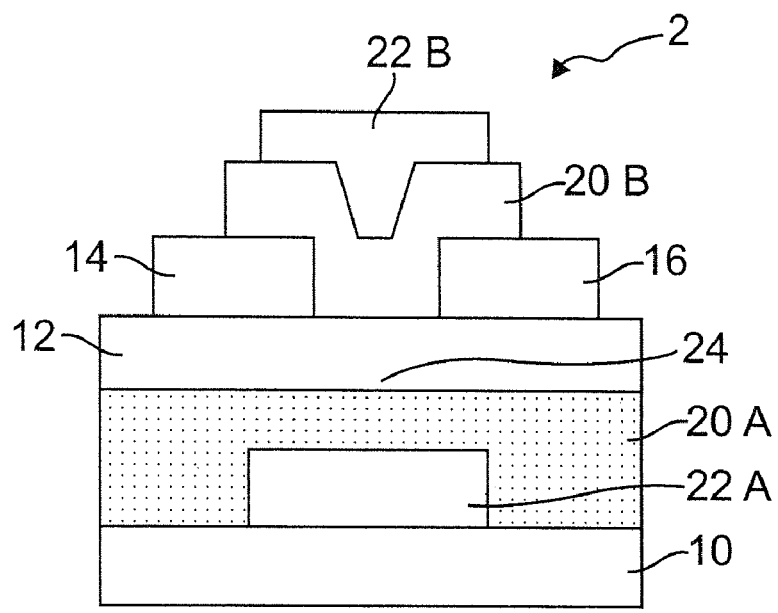
FIG. 4 is a schematic sectional view of a field effect transistor according to a fourth embodiment of the present invention.

FIG. 4 is a schematic sectional view of a field effect transistor 2 according to a fourth embodiment of the present invention. This embodiment is a combination of the embodiments shown in FIGS. 1 and 3. It comprises a source electrode 14 and a drain electrode 16 on top of a channel layer 12 and two gate electrodes 22a, 22b, each separated from the channel layer 12 by an insulating layer 20a, 20b. One gate electrode 22a is arranged between the substrate 10 and the insulating layer 20a, whereby the insulating layer 20a insulates the gate 22a from the channel layer 12. The other gate 22b is separated and electrically insulated from the channel layer 12 and the source and drain electrodes 14, 16 by the insulating layer 20b.

Thus, the embodiment shown in FIG. 4 comprises both the front side gate electrode of the embodiment shown in FIG. 1 and the back side gate electrode of the embodiment shown in FIG. 3.

As shown in FIGS. 1 to 4, a broad variety of device structures can be used advantageously for the field effect transistor according to the present invention. In particular, staggered, co-planar, staggered-inverted or co-planar-inverted structures with single and/or multiple gate electrodes may be used, wherein each gate electrode may be insulated by an insulating layer as shown in FIGS. 1, 3 and 4, or by a Schottky barrier (Schottky gate), as shown in FIG. 2.

A variety of materials can be used advantageously for the inventive field effect transistor and particularly for its channel layer 12 or its channel 24, respectively. Good results have particularly been achieved with strontium titanate $SrTiO_3$, doped with (up to about 20%) chromium Cr as described above.

When the switching material of the channel layer 12 is Cr-doped $SrTiO_3$, it is preferred and advantageous to use undoped $SrTiO_3$ as the insulating dielectric material of the insulating layer 14. In this case, the Cr-doped $SrTiO_3$ switching material can be epitaxially grown or deposited on top of the undoped $SrTiO_3$ dielectric layer 14 or vice versa. This provides the additional benefit of a perfect epitaxial structure without crystal defects at the interface of the switching layer and the insulating layer.

Numerous other materials can be used as well, such as chalcogenide. Chalcogenide compounds are compounds which comprise sulfur, selenium or tellurium.

Good results have been achieved in particular with $SrZrO_3$, $BaSrTiO_3$, $Ta_2O_5$, $Ca2Nb_2O_7$ (Pr, Ca) $MnO_3$ and other materials with perovskite or perovskite-like crystal structure, each material doped preferentially with Cr, V or Mn. Further, the materials described in the above mentioned articles "Reproducible switching effect in thin oxide films for memory applications" (A. Beck et al., Applied Physics letters, Vol. 77, No. 1, July 2000), "Current-driven insulator-conductor transition and nonvolatile memory in chromium-doped $SrTiO_3$ single crystals" (Y. Watanabe et al., Applied Physics Letters, Vol. 78, No. 23, June 2001) and "Electrical current distribution across a metal-insulator-metal structure during bistable switching" (C. Rossel et al., *Journal of applied Physics*, Vol. 90, No. 6, September 2001) and in the international application publication WO 00/49659 A1 are advantageously usable in field effect devices according to the present invention.

The persistence of the effect, i.e., the time duration of the change in conductivity, depends on several factors including: device temperature, electrical fields applied to the switching material, density or number of injected charge carriers, and pulse length and sequence. This means that the persistence of the conductivity states can be influenced by heating the device, by application of a bias voltage to the switching material and by the density or number of charge carriers initially injected into the switching material. On the other hand, at least one conductivity state, namely the higher conductivity state, can be terminated at an arbitrary moment by applying a sufficient amount of heat or a sufficient voltage to the channel layer 12.

Figure 5:
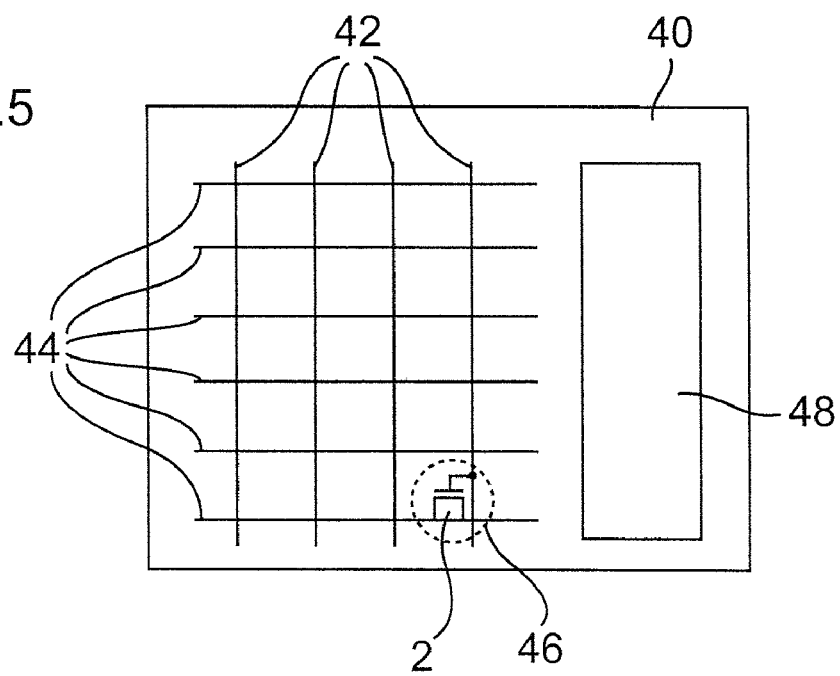
FIG. 5 is a schematic representation of a memory device according to the present invention.

FIG. 5 schematically displays a memory device 40. The memory device 40 comprises a plurality of storage cells arranged at cross points of word lines 42 and bit lines 44. Only one of the storage cells is displayed in FIG. 5 in a schematic and exemplary way and circumscribed by a dotted line 46. Like the exemplary storage cell 46, each of the plurality of storage cells comprises a field effect transistor 2 according to one of the above-described embodiments.

In the memory device 40 shown in FIG. 5 one bit of information can be stored in each storage cell, the lower conductivity state of the switching material of the channel layer 12 being assigned to a logical "0" and the higher conductivity state of the switching material of the channel layer 12 being assigned to a logical 1 or vice versa. Alternatively, more than two distinct conductivity states of the switching material corresponding to and resulting in a respective number of different conductivity values of the channel of the field effect transistor can be used to store more than one bit of information in each storage cell 46.

Further parts of the memory device 40, for example multiplexers and demultiplexers, sense amplifiers and other circuits for writing, reading and other operations of the memory device 40 are subsumed schematically in a control circuit 48.

Another application for the field effect device or transistor according to the present invention is a pixel control device for an emissive or reflective display device. This pixel control device may be an integral part of the display device or a separate device. In a preferred embodiment, the pixel control device comprises an array of field effect transistors 2, each field effect transistor 2 being associated with one pixel of the display device and persistently storing information about the grey-scale, the brightness or the color of the pixel.

Furthermore, the field effect device or transistor according to the present invention can be used advantageously as a circuit element in application-specific integrated circuits (ASICs).

Furthermore, the field effect device or transistor according to the present invention can be used advantageously as circuit element in an amplifier circuit, the conductivity states of the switching material corresponding to or resulting in associated gain levels of the amplifier circuit.

Furthermore, the field effect device or transistor according to the present invention can be used advantageously as a sensor element or as part of a sensor circuit. The field effect transistor may be part of a circuit influencing the sensitivity or the effective sensitivity of the sensor, for example a power supply circuit or a circuit pre-amplifying a primary sensor signal. In this case, the conductivity states of the switching material correspond to or result in associated sensitivity levels of the sensor circuit. Alternatively, the field effect transistor or its channel may be the primary sensor.

In all the embodiments and for all the applications described above, the conductivity states of the switching material may form only a part of the channel layer 12, in particular the channel 24 between the source electrode 14 and the drain electrode 16 underneath or above the gate electrode 22, or the whole channel layer 12 may be formed of the switching material. The conductivity states of the switching material may range from insulating states to highly conductive states or even to superconducting states whereby the conductivities in the lower conductivity state and in the higher conductivity state may differ by several percents or, preferably, by a factor of 2 to 10 or even up to 1000 or more.

As an alternative to the electrical switching of the conductivity state of the switching material of the channel 24, the same is done by applying heat or light, both of which may for example be applied by means of a laser beam of appropriate wavelength and intensity.

For all mechanisms of switching the conductivity state of the switching material of the channel 24, it should be mentioned that the same shows hysteresis, i.e., even after the end of an application of an electrostatic field, electrical current, heat, light, etc., the conductivity state into which the switching material is driven at least partly remains for some time.

Preferably and most advantageously, the conductivity states persist for an infinite time ("forever"). Typically, the conductivity states persist for several years (at room temperature). Even if the conductivity states of the switching material of the channel layer 12 merely persist for days, hours or seconds and should be refreshed like the storage cells in a DRAM device, the present invention is advantageous as the refresh period will still be much longer than in a conventional DRAM device.

The substrate 10 may be a monocrystalline, polycrystalline or amorphous semiconductor or isolator, ceramic, plastic, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A field effect device, comprising:
   a source electrode;
   a drain electrode spaced laterally apart from the source electrode;
   a channel formed between the source electrode and the drain electrode; and
   a gate electrode separated from the channel by an insulating layer,
   wherein the channel comprises a switching material reversibly switchable between a first conductivity state and a second conductivity state by at least one of: (i) application of a predetermined voltage between the source electrode and the drain electrode or between the gate electrode and at least one of the source electrode and the drain electrode, (ii) application of a voltage or a current to the switching material in the channel, and (iii) application of at least one of heat and light, the first conductivity state having an electrical conductivity which is lower than an electrical conductivity of the second conductivity state, each of the conductivity states being persistent without a need for a sustaining excitation signal including at least one of an electrical field, heat and light applied to the device;
   wherein: (i) when in a given one of the persistent conductivity states, application of a voltage having a magnitude which is greater than a prescribed voltage level to the gate electrode relative to at least one of the source electrode and drain electrode causes the switching material to switch between the first conductivity state and the second conductivity state or between the second conductivity state and the first conductivity state as a function of a polarity of the voltage applied to the gate electrode; and (ii) application of a voltage having a magnitude which is less than or equal to the prescribed voltage level to the gate electrode relative to at least one of the source electrode and drain electrode causes a non-persistent change in the conductivity of the switching material, an amount of non-persistent change in the conductivity being a function of at least one of the magnitude and the polarity of the voltage applied to the gate electrode, whereby varying the voltage applied to the gate electrode causes a modulation of the electrical conductivity of the given conductivity state when the magnitude of the voltage is less than or equal to the prescribed voltage level and causes a switching of the conductivity state when the magnitude of the voltage is greater than the prescribed voltage level.

* * * * *